United States Patent
Wuu et al.

(10) Patent No.: US 8,278,194 B2
(45) Date of Patent: Oct. 2, 2012

(54) METHOD FOR FABRICATING SEMICONDUCTOR DEVICES AND A SEMICONDUCTOR DEVICE MADE THEREFROM

(75) Inventors: Dong-Sing Wuu, Taichung (TW);
Ray-Hua Horng, Taichung (TW);
Chia-Cheng Wu, Taichung (TW);
Cheng-Ying Yen, Taichung (TW)

(73) Assignee: National Chung-Hsing University, Taichung (TW)

( * ) Notice: Subject to any disclaimer, the term of this patent is extended or adjusted under 35 U.S.C. 154(b) by 53 days.

(21) Appl. No.: 13/047,442

(22) Filed: Mar. 14, 2011

(65) Prior Publication Data

US 2011/0227213 A1 Sep. 22, 2011

(30) Foreign Application Priority Data

Mar. 17, 2010 (TW) ................................ 99107764 A

(51) Int. Cl.
*H01L 21/36* (2006.01)
(52) U.S. Cl. .......... 438/481; 438/46; 438/704; 438/689; 438/464; 257/734
(58) Field of Classification Search .................. 438/481, 438/704, 46, 689, 464; 257/734
See application file for complete search history.

(56) References Cited

U.S. PATENT DOCUMENTS

| | | | | |
|---|---|---|---|---|
| 6,071,795 A * | 6/2000 | Cheung et al. | ............... | 438/458 |
| 6,339,010 B2 * | 1/2002 | Sameshima | ................... | 438/458 |
| 6,768,138 B1 * | 7/2004 | Kitada et al. | .................. | 257/127 |
| 6,828,217 B2 * | 12/2004 | Nguyen et al. | ............... | 438/462 |
| 6,936,524 B2 * | 8/2005 | Zhu et al. | ....................... | 438/459 |
| 7,348,680 B2 * | 3/2008 | Rotaru et al. | ................. | 257/786 |
| 7,470,625 B2 * | 12/2008 | Li et al. | ......................... | 438/706 |
| 2007/0245542 A1 * | 10/2007 | Horng et al. | .................... | 29/594 |
| 2011/0159624 A1 * | 6/2011 | Chen et al. | ...................... | 438/42 |

* cited by examiner

*Primary Examiner* — Marcos D. Pizarro
*Assistant Examiner* — Bilkis Jahan
(74) *Attorney, Agent, or Firm* — Foley & Lardner LLP

(57) ABSTRACT

A method for fabricating semiconductor devices includes: (a) forming over a temporary substrate a sacrificial film layer; (b) growing laterally and epitaxially an epitaxial film layer; (c) forming over the epitaxial film layer a patterned mask that covers partially the epitaxial film layer and that defines a plurality of through holes to expose a plurality of epitaxial surface regions, respectively; (d) forming a plurality of conductive members respectively in the through holes and on the epitaxial surface regions; (e) removing the patterned mask and removing a part of the epitaxial film layer and a part of the sacrificial film layer beneath the patterned mask; (f) removing the sacrificial film layer; and (g) removing the temporary substrate.

13 Claims, 12 Drawing Sheets

METHOD FOR FABRICATING SEMICONDUCTOR DEVICES AND A SEMICONDUCTOR DEVICE MADE THEREFROM

CROSS-REFERENCE TO RELATED APPLICATION

This application claims priority of Taiwanese application no. 099107764, filed on Mar. 17, 2010.

BACKGROUND OF THE INVENTION

1. Field of the Invention

This invention relates to a method for fabricating semiconductor devices and a semiconductor device made therefrom, more particularly to a method for fabricating semiconductor devices involving removing a temporary substrate without cutting a semiconductor structure formed thereon.

2. Description of the Related Art

Currently, there are various optoelectronic semiconductor devices on the market. Taking an example of a vertical-conducting light-emitting diode (LED), referring to FIG. 1, such optoelectronic semiconductor device 1 comprises a conductive member 11, an epitaxial structure 12 disposed on the conductive member 11, and an electrode 13 disposed on the epitaxial structure 12. By virtue of electrical connection with the conductive member 11 and the electrode 13, electricity may be supplied to the epitaxial structure 12 so that light may be emitted through an optoelectronic effect.

When fabricating the optoelectronic semiconductor device 1 (the vertical-conducting LED), a sapphire ($Al_2O_3$) substrate, which has a better lattice match for an epitaxial film layer formed thereon and is in a form of a wafer, is selected to serve as a temporary substrate. Then, on the temporary substrate, the epitaxial film layer of gallium nitride (GaN) is epitaxially grown; a conductive layer serving as a permanent substrate (which forms a plurality of the conductive members 11 after cutting) is formed on the epitaxial film layer; and the temporary substrate is subsequently removed from the epitaxial film layer. Thereafter, a plurality of the electrodes 13 are formed on a surface of the epitaxial film layer that is exposed after the temporary substrate is removed, followed by cutting into a plurality of the optoelectronic semiconductor devices 1.

In the above conventional process, the temporary substrate is removed from the epitaxial film layer using a laser lift-off process or a mechanical polishing process. However, the laser lift-off process involves a relatively high fabrication cost, whereas the mechanical thinning process involves the step of directly grinding and polishing off the temporary substrate. The mechanical thinning process is likely to induce a residual stress that could damage the structure of the epitaxial layer stack.

SUMMARY OF THE INVENTION

Therefore, an object of the present invention is to provide a method for efficiently and economically fabricating semiconductor devices.

Another object of the present invention is to provide a semiconductor device produced by the above method.

According to one aspect of the present invention, there is provided a method for fabricating semiconductor devices, comprising:

(a) forming over a temporary substrate a sacrificial film layer having a plurality of spaced apart sacrificial film portions, which expose partially the temporary substrate;

(b) growing laterally and epitaxially an epitaxial film layer over the sacrificial film layer and the temporary substrate;

(c) forming over the epitaxial film layer a patterned mask that covers partially the epitaxial film layer and that defines a plurality of through holes to expose a plurality of epitaxial surface regions, respectively;

(d) forming a plurality of conductive members respectively in the through holes and on the epitaxial surface regions;

(e) removing the patterned mask and removing a part of the epitaxial film layer and a part of the sacrificial film layer beneath the patterned mask until a portion of the temporary substrate therebeneath is exposed, thereby forming gaps among the conductive members and dividing the epitaxial film layer into a plurality of epitaxial structures;

(f) removing the sacrificial film layer by wet etching; and (g) after the step (f), removing the temporary substrate by wet etching.

According to another aspect of the present invention, there is provided a semiconductor device produced by the above method, comprising:

an epitaxial structure having a first side formed with a plurality of alternating protrusions and indentations, and a rough surface on the alternating protrusions and indentations; and a conductive member formed on a second side of the epitaxial structure opposite to the first side.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
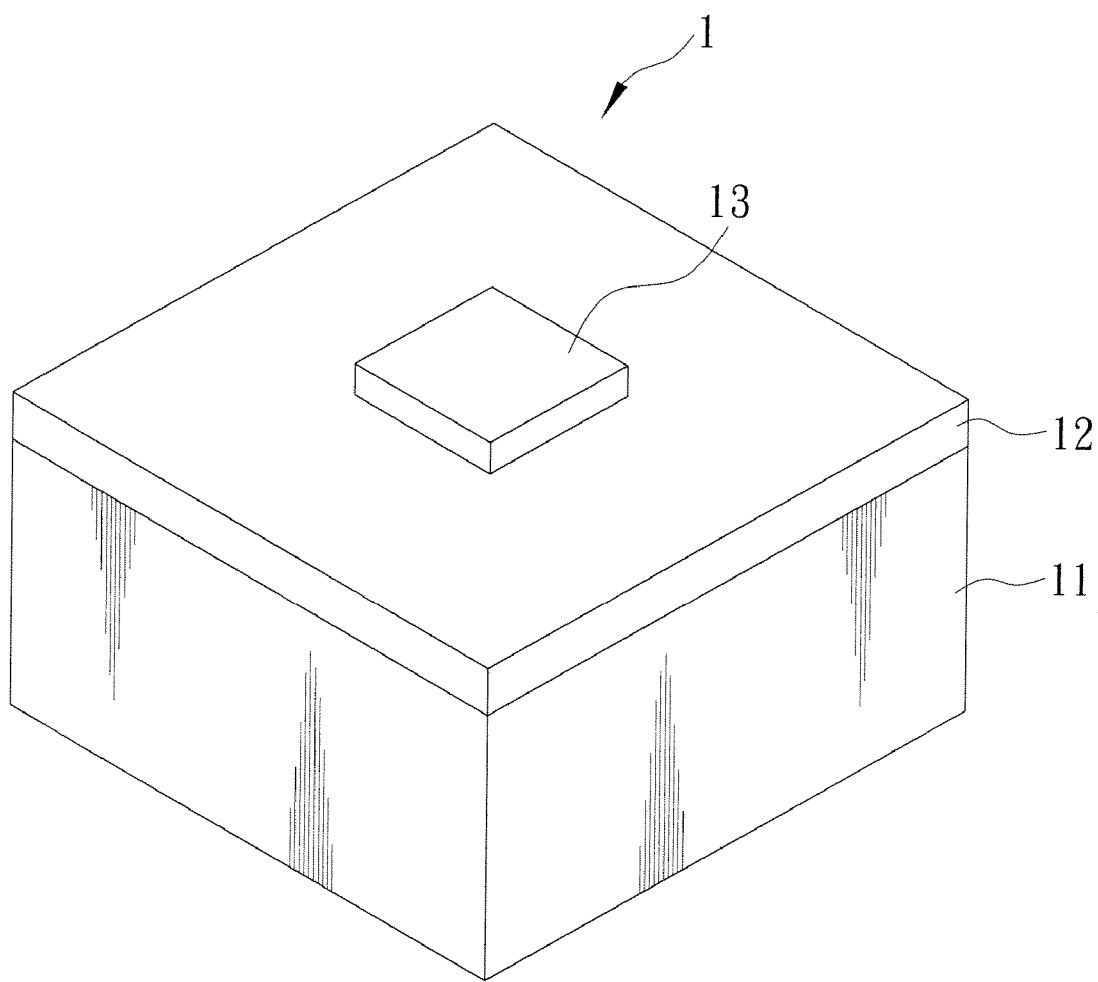
FIG. 1 is a schematic view of a conventional vertical-conducting light emitting diode.

Before the present invention is described in greater detail with reference to the accompanying preferred embodiments, it should be noted herein that like elements are denoted by the same reference numerals throughout the disclosure.

Figure 3:
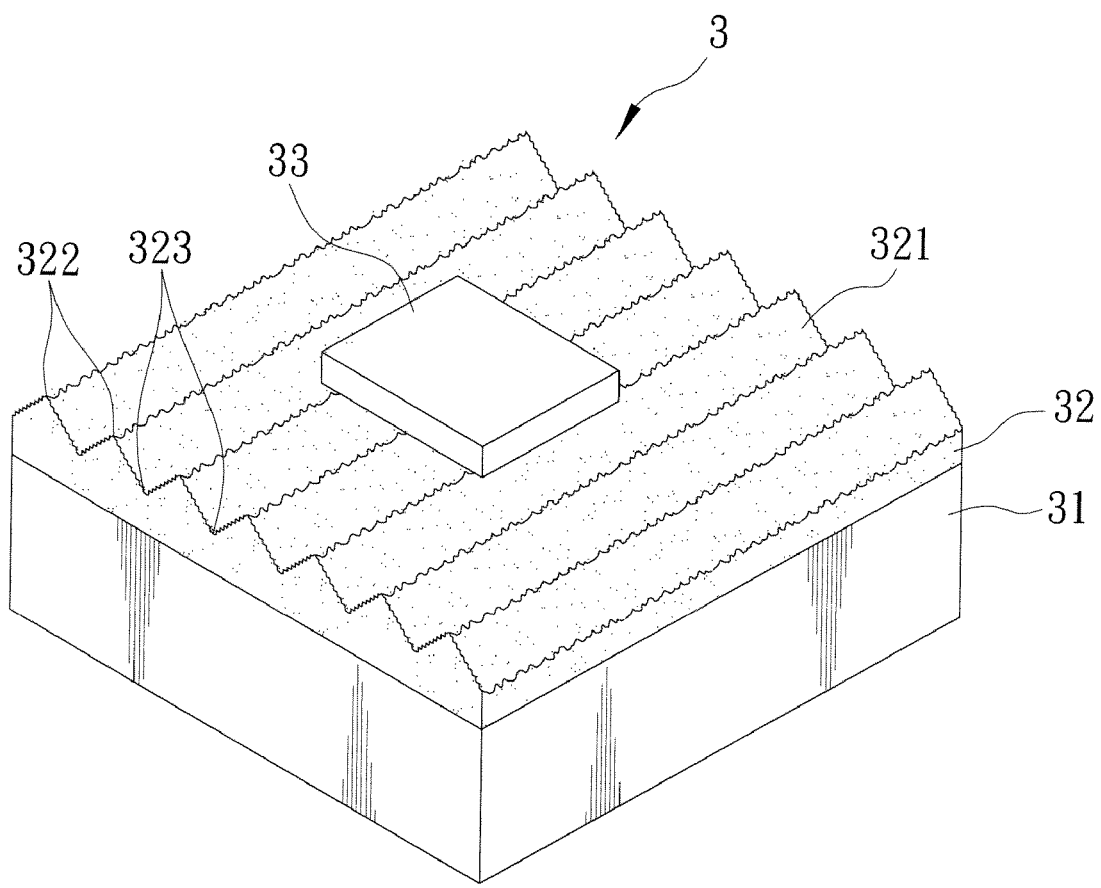
FIG. 3 is a schematic view of a semiconductor device produced by the method illustrated in FIG. 2.

Referring to FIG. 3, the first preferred embodiment of a semiconductor device 3 according to the present invention includes a conductive member 31, an epitaxial structure 32, and an electrode 33.

The epitaxial structure 32 has a first side formed with a plurality of alternating protrusions 322 and indentations 323, and a rough surface 321 on the alternating protrusions 322 and indentations 323. Preferably, the protrusions 322 are configured as elongate strips that are substantially parallel to each other.

The conductive member 31 is formed on a second side of the epitaxial structure 32 opposite to the first side.

The electrode 33 is formed on the rough surface 321 of the epitaxial structure 32. By virtue of electrical connection with the conductive member 31 and the electrode 33, electricity may be supplied to the epitaxial structure 32 so that light may be emitted.

More specifically, when the electricity is applied to the epitaxial structure 32, it passes through the epitaxial structure 32 to enable the epitaxial structure 32 to emit light outwardly from the rough surface 321. Since the rough surface 321 contributes to reduce the possibility of total reflection of the light so that the light generated from the epitaxial structure 32 may be emitted outwardly in a relatively high percentage, the brightness of light from the optoelectronic semiconductor device 3 may be greatly enhanced.

Figure 2:
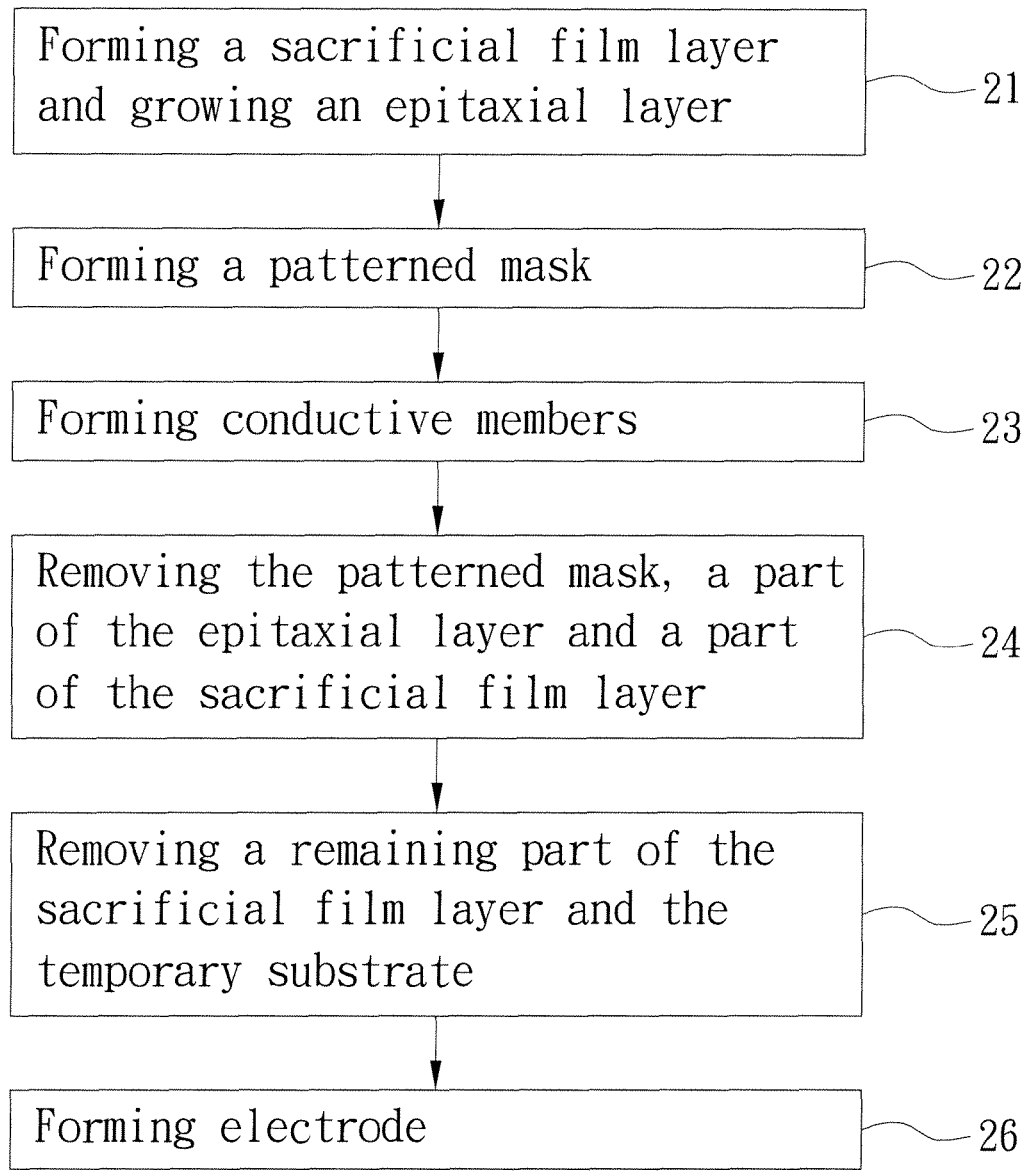
FIG. 2 is a flowchart showing the first preferred embodiment of a method for fabricating semiconductor devices according to the present invention.

As shown in FIG. 2, a method for fabricating optoelectronic semiconductor devices 3 according to the first preferred embodiment of the present invention includes steps 21 to 26.

Figure 4:
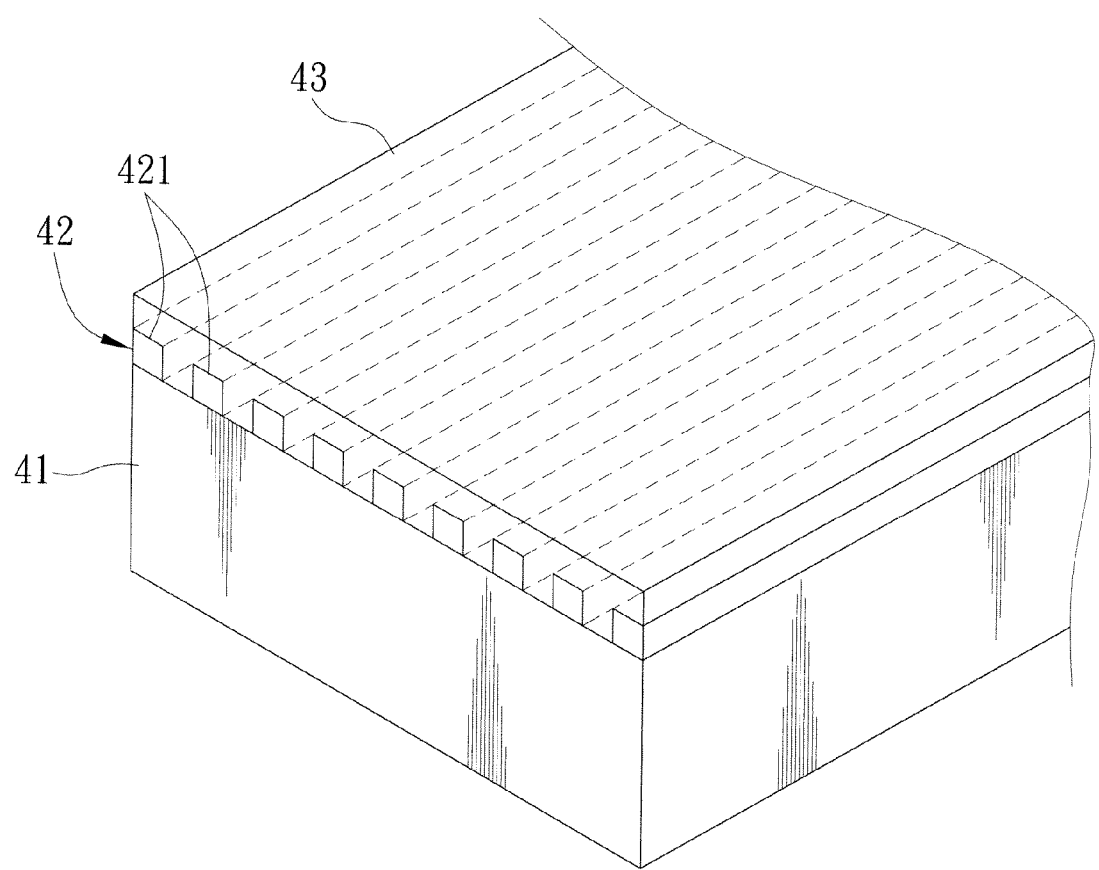
FIG. 4 is a schematic view for illustrating the steps of forming a sacrificial film layer and an epitaxial film layer in sequence on a temporary substrate in the first preferred embodiment of the method of this invention.

In the step 21, a sacrificial film layer 42 that may be made of silicon oxide ($SiO_x$) is formed over a temporary substrate 41 in a form of a wafer, as best shown in FIG. 4. Preferably, the sacrificial film layer 42 has a plurality of spaced apart sacrificial film portions 421, which expose partially the temporary substrate 41. More preferably, the plurality of spaced apart sacrificial film portions 421 are configured as a plurality of substantially parallel strips. Then, an epitaxial film layer 43 that may be made of gallium nitride (GaN) series semiconductor material is laterally and epitaxially grown over the sacrificial film layer 42 and the temporary substrate 41 (see FIG. 4). In addition to silicon oxide ($SiO_x$), the sacrificial film layer 42 may be made of various materials that may be selected based on an etching agent used in the following wet etching processes, and that include for example, zinc oxide, silicon nitride, titanium nitride, chromium nitride, etc.

Figure 5:
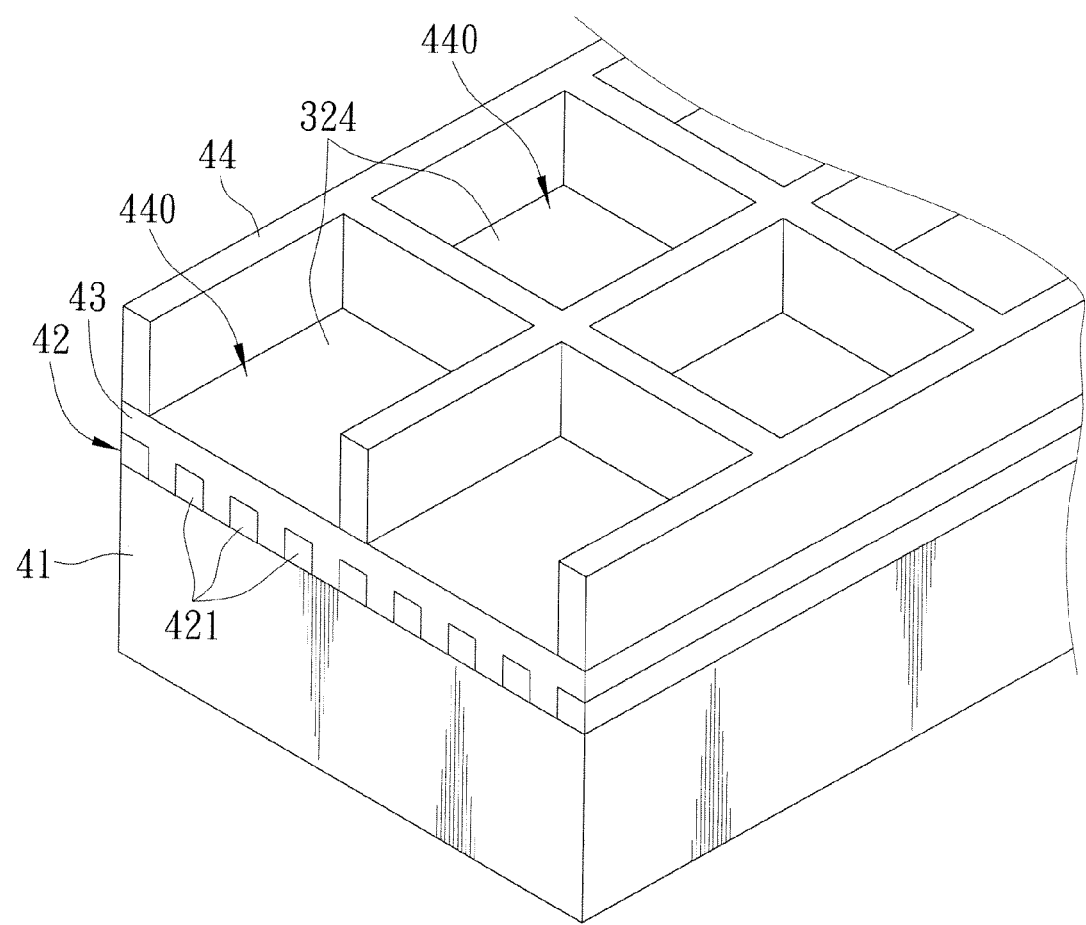
FIG. 5 is a schematic view for illustrating the step of forming a patterned mask over the epitaxial film layer in the first preferred embodiment of the method of this invention.

In the step 22, a patterned mask 44 is formed over the epitaxial film layer 43 using lithography technology (see FIG. 5). The patterned mask 44 covers partially the epitaxial film layer 43 and defines a plurality of through holes 440 to expose a plurality of epitaxial surface regions 324, respectively. In this preferred embodiment, the through holes 440 are four-sided.

Figure 6:
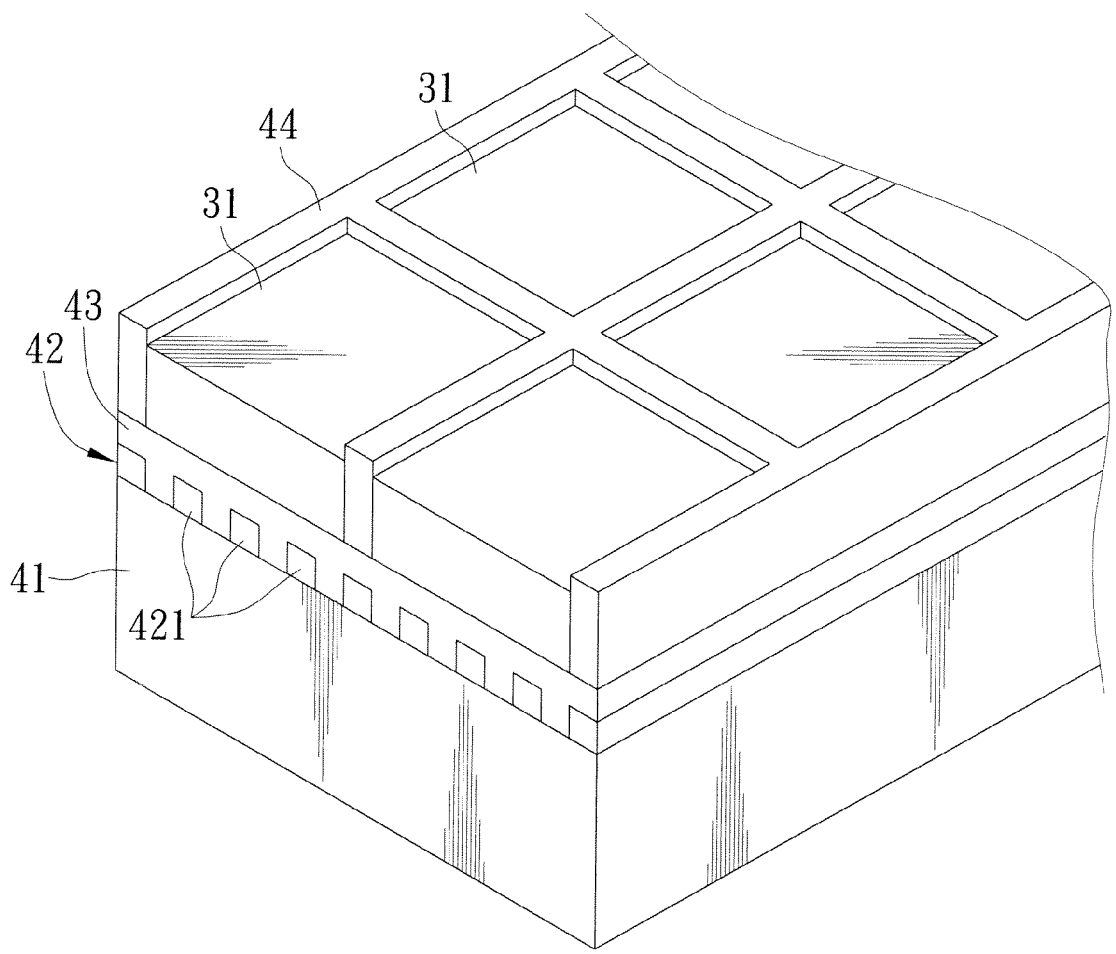
FIG. 6 is a schematic view for illustrating the step of respectively forming a plurality of conductive members in a plurality of through holes of the patterned mask in the first preferred embodiment of the method of this invention.

In the step 23, a plurality of conductive members 31 are formed respectively in the through holes 440 and on the epitaxial surface regions 324 to respectively and electrically connect to the corresponding one of the epitaxial surface regions 324 (see FIG. 6). Since the epitaxial surface regions 324 are spaced apart by the patterned mask 44, the conductive members 31 are also formed separately. Preferably, the step 23 is conducted by an electroplating technique with a mask.

Figure 7:
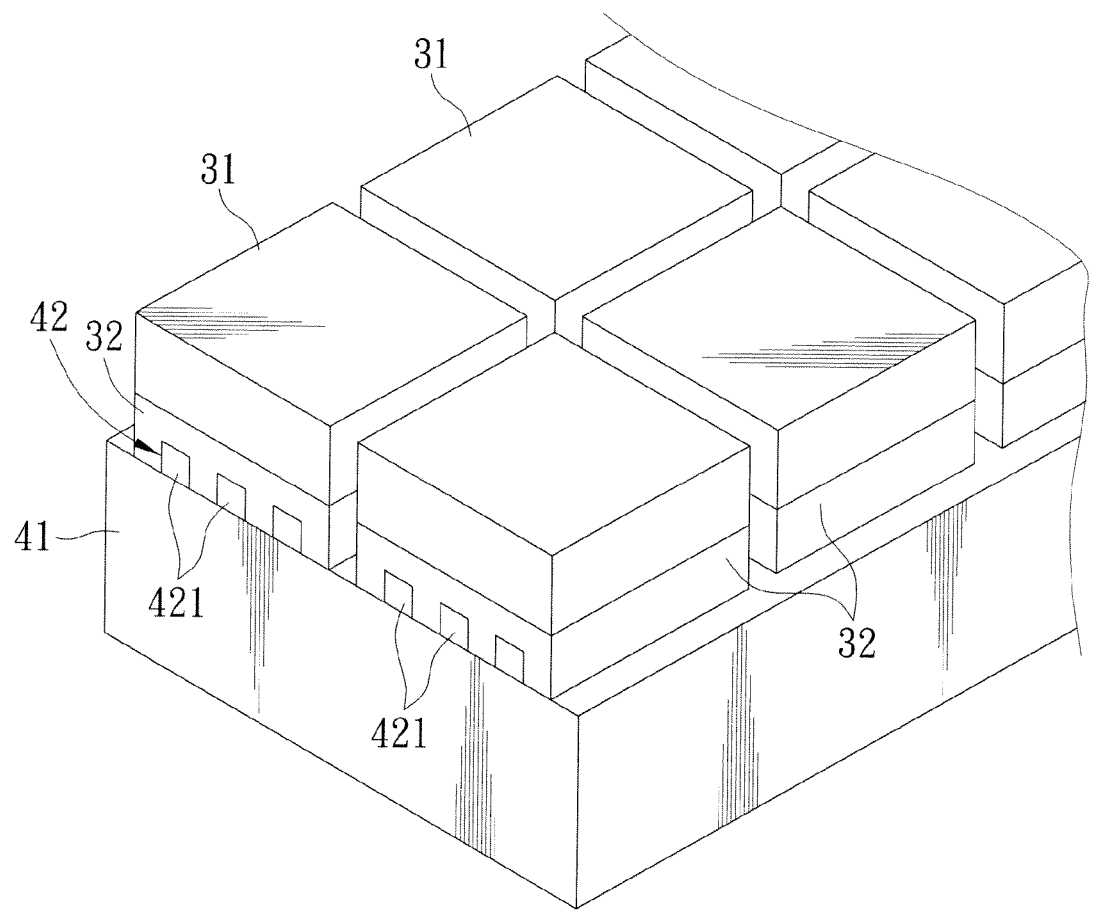
FIG. 7 is a schematic view for illustrating the step of removing the patterned mask, a part of the epitaxial film layer and a part of the sacrificial film layer in the first preferred embodiment of the method of this invention.

In the step 24, the patterned mask 44 is removed using an inductively coupled plasma process, and then, a part of the epitaxial film layer 43 and a part of the sacrificial film layer 42 beneath the patterned mask 44 are removed until a portion of the temporary substrate 41 therebeneath is exposed (see FIG. 7), thereby forming gaps among the conductive members 31 and dividing the epitaxial film layer 43 into a plurality of epitaxial structures 32.

Figure 8:
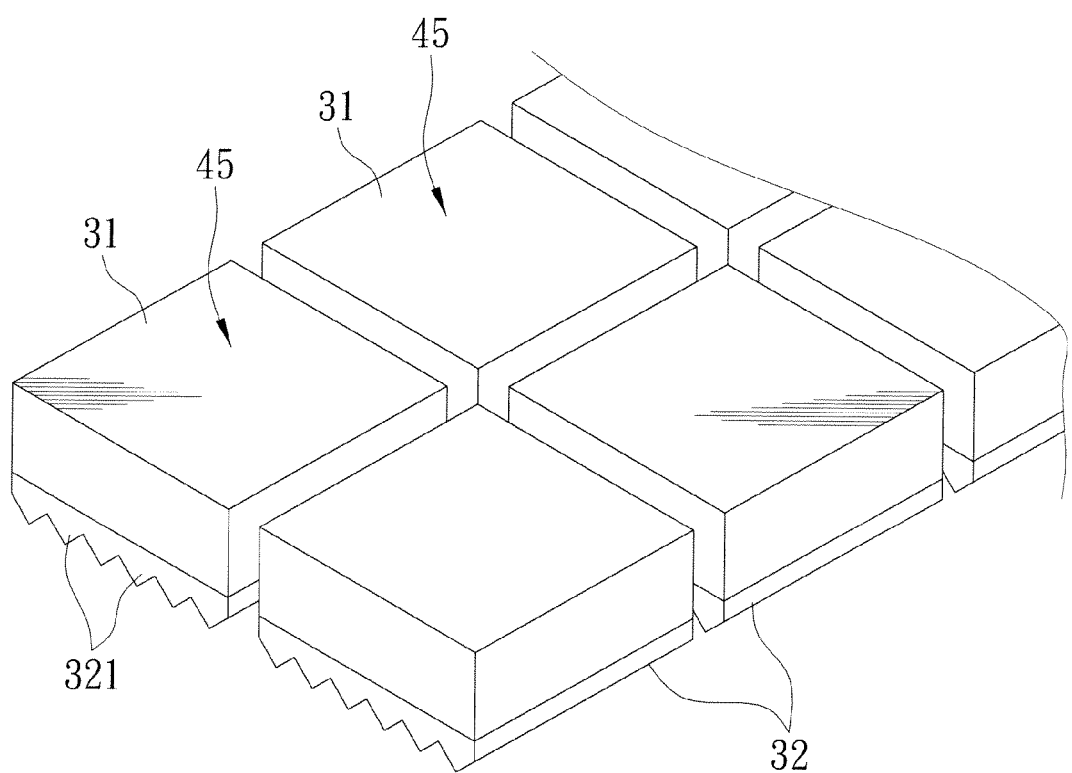
FIG. 8 is a schematic view for illustrating the step of dividing the epitaxial film layer into a plurality of epitaxial structures in the first preferred embodiment of the method of this invention.
Figure 9:
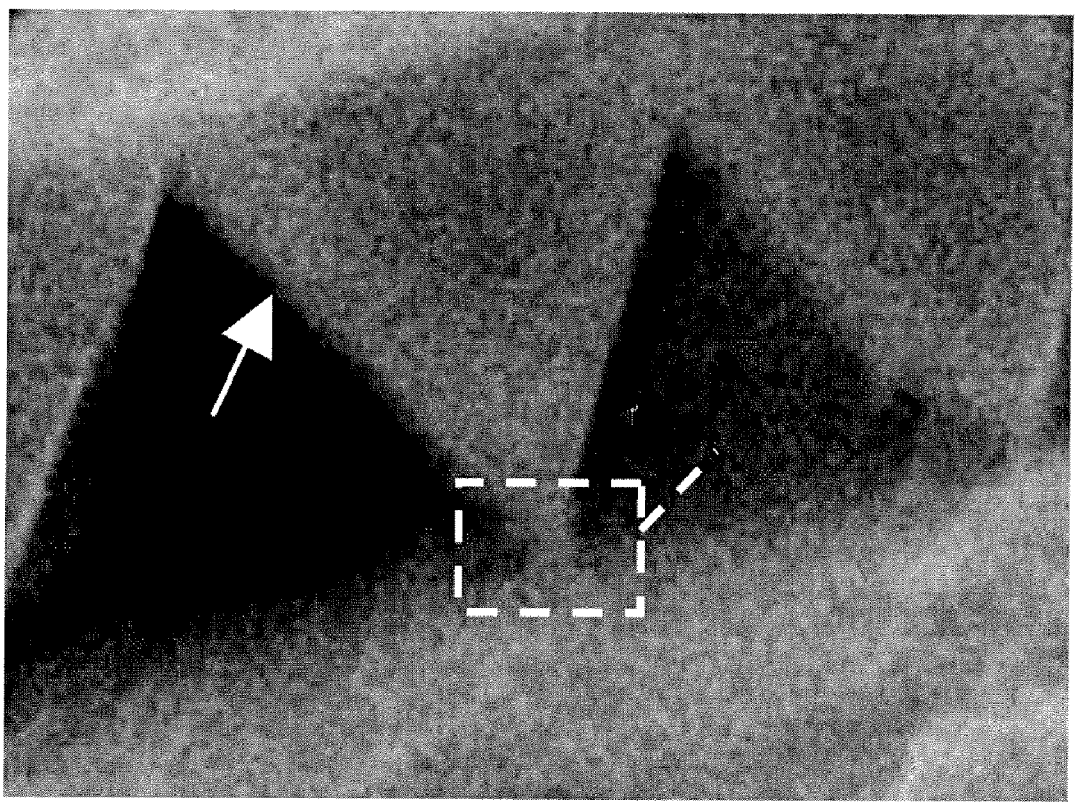
FIG. 9 is a scanning electron microscope photograph of topography of the textured surface of one of the epitaxial structure after the temporary substrate is removed therefrom.

In the step 25, a remaining part of the sacrificial film layer 42 is removed through the gaps among the conductive members 31 and gaps among the epitaxial structures 32 using wet etching, and then, the temporary substrate 41 is also removed by wet etching (see FIG. 8). After the step 25, a plurality of semi-finished products 45 of the semiconductor devices 3 are separated from the temporary substrate 41. With the removal of the sacrificial film layer 42 and the temporary substrate 41, the surface of the epitaxial structures 32 would be roughened to form the rough surface 321 (see FIGS. 3 and 9).

In the step 25 of this preferred embodiment, the remaining part of the sacrificial film layer 42 made of silicon oxide is wet etched using hydrofluoric acid, and subsequently, the temporary substrate 41 is removed from the epitaxial structures 32 using a mixture of phosphoric acid and sulfuric acid ($H_3PO_4$:$H_2SO_4$=3:1) having a temperature of 260° C. Besides, the temporary substrate 41 may be removed from the epitaxial structures 32 by single use of other chemicals, such as phosphoric acid or potassium hydroxide, etc. The selection of suitable etching agents is not the technical feature of this invention and can be determined by a skilled artisan depending upon actual requirements.

In the step 26, which is conducted after the step 25, an electrode 33 (see FIG. 3) is formed on a surface of each of the epitaxial structures 32 opposite to a corresponding one of the conductive members 31. After the step 26, a plurality of the semiconductor devices 3, one of which is shown in FIG. 3, may be obtained.

By virtue of the method for fabricating the semiconductor devices 3 according to the present invention, the conductive members 31 can be separately formed using the patterned mask 44. The epitaxial film layer 43 can be divided into the epitaxial structures 32 with the removal of the part of the epitaxial film layer 43 and the part of the sacrificial film layer 42 beneath the patterned mask 44. The gaps among the conductive members 31 and the gaps among the epitaxial structures 32 also accelerate the speeds of the removal of the remaining part of the sacrificial film layer 42 and the temporary substrate 41. Therefore, after the removal of the temporary substrate 41, the semi-finished products 45 of the semiconductor devices 3 are separated without using a cutting process.

In the present invention, since the cutting process is not necessary and since the temporary substrate 41 is removed by wet etching (not by the mechanical polishing process or the laser lift-off process), (1) the structural integrity of the epitaxial structures 32 can be enhanced, (2) no residual stress is imparted to the epitaxial film layer 43 that could adversely affect quantum efficiency inside the semiconductor devices 3, and (3) the method of this invention can be conducted at a relatively low cost and in a more time-saving way. On the other hand, the epitaxial structure 32 of each semiconductor device 3 is roughened simultaneous with removal of the sacrificial film layer 42 during the wet etching process to have the rough surface 321. Hence, the light generated from the epitaxial structure 32 is emitted outwardly in a relatively high percentage, and the brightness of light from the semiconductor devices 3 is effectively enhanced.

Figure 10:
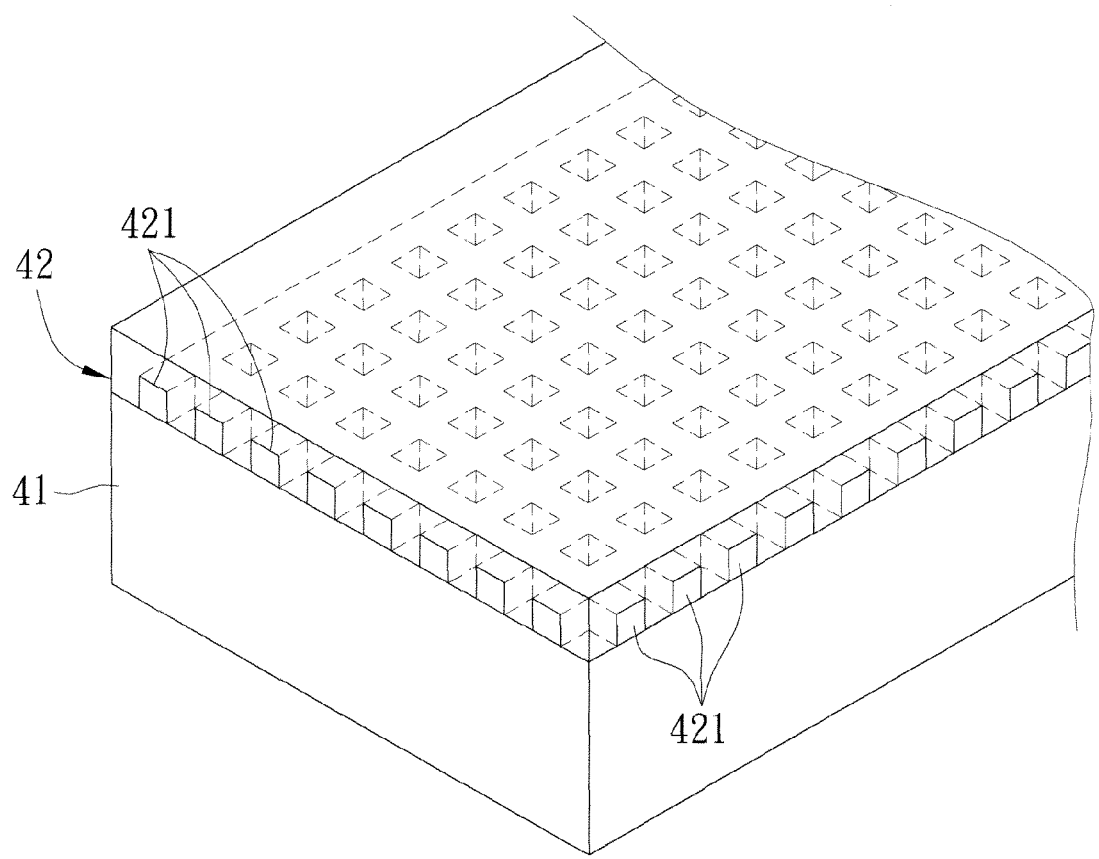
FIG. 10 is a schematic view for illustrating a sacrificial film layer used in a method for fabricating semiconductor devices according to the second preferred embodiment of the present invention.

FIG. 10 illustrates the sacrificial film layer 42 used in a method for fabricating optoelectronic semiconductor devices according to the second preferred embodiment of the present invention. In the second preferred embodiment, the sacrificial film portions 421 of the sacrificial film layer 42 are configured as a plurality of intersecting strips, by which the epitaxial film layer 43 may grow laterally and epitaxially in a relatively high speed, and by which the removal of the temporary substrate 41 may be conducted more easily. The sacrificial film layer 42, for example, may be formed by patterning a layer on the temporary substrate 41 using lithography technology. Accordingly, in the second preferred embodiment of the present invention, the semiconductor device 3 has the protrusions 322 configured as elongate strips that intersect each other.

Figure 11:
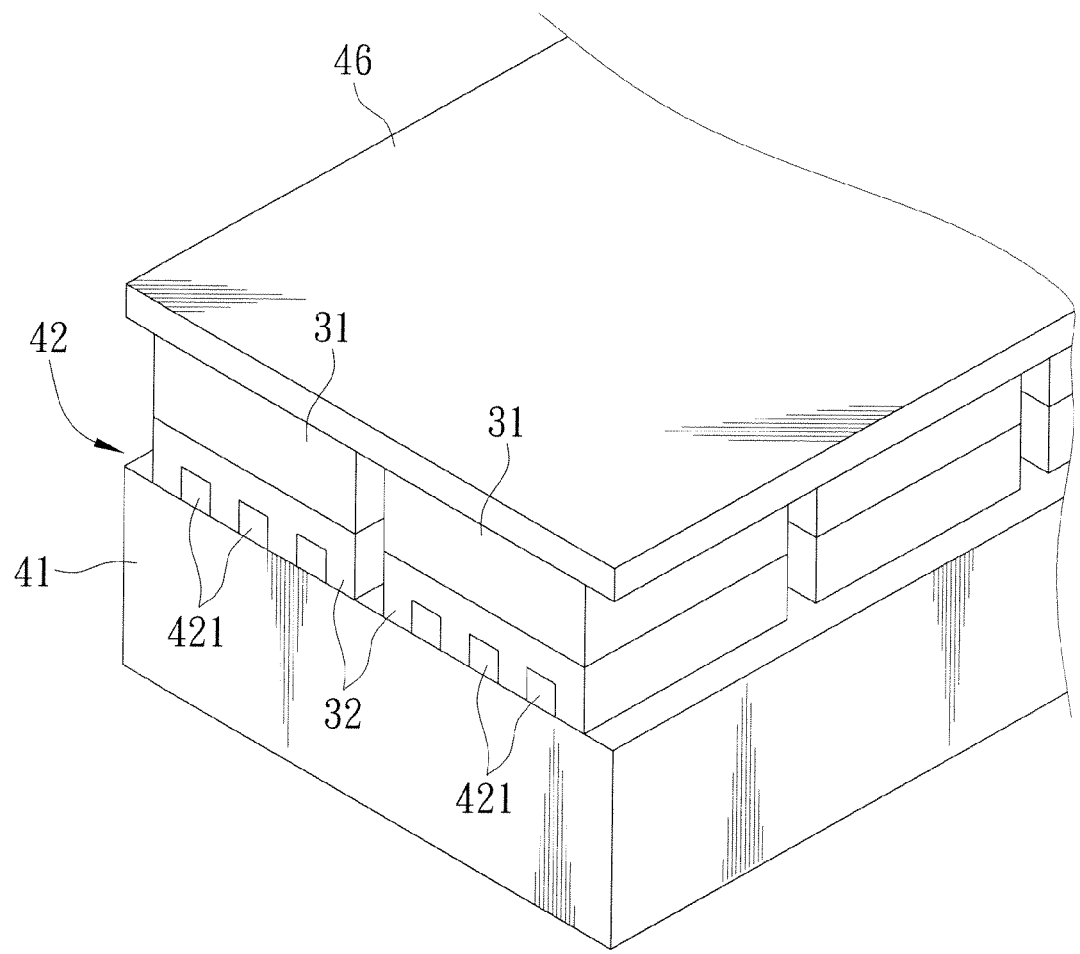
FIG. 11 is a schematic view for illustrating a removable plate used in a method for fabricating semiconductor devices according to the third preferred embodiment of the present invention.

FIG. 11 illustrates a removable plate 46 used in fabricating the third preferred embodiment of the optoelectronic semiconductor devices 3 according to the present invention. The removable plate 46 is attached to surfaces of all of the conductive members 31 between the steps 24 and 25. After the steps 25 and 26, the semiconductor devices 3 may be separated from the removable plate 46 and be processed to a downstream packaging process.

Figure 12:
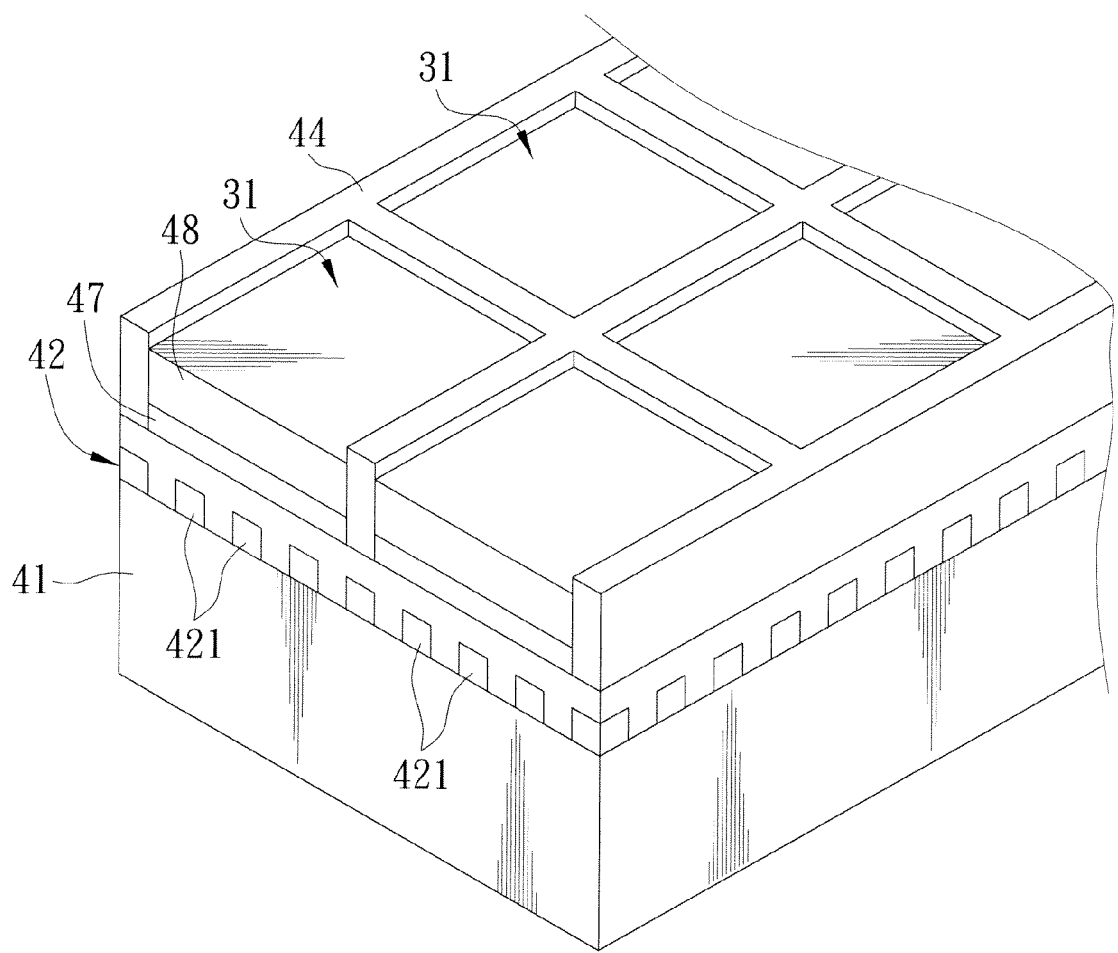
FIG. 12 is a schematic view to illustrate forming each of conductive members by first forming a reflective conductive film, followed by forming a non-reflective conductive film using electroplating in the fourth preferred embodiment according to the present invention.

FIG. 12 illustrates that the conductive members 31, in the fourth preferred embodiment according to the present invention, are formed by first forming a reflective conductive film 47 on each of the epitaxial surface regions 324 (see FIG. 5), followed by forming a non-reflective conductive film 48 on the reflective conductive film 47 that has been formed on each of the epitaxial surface regions 324. The reflective conductive film 47 is preferably formed by physical vapor deposition (e.g. sputtering, electron-beam evaporation, thermal evaporation) and is made of a metal or an alloy with a relatively high reflectivity to serve as a seed crystal layer for the non-reflective conductive film 48. The non-reflective conductive film 48 is preferably formed by electroplating. Accordingly, in the fourth preferred embodiment of the present invention, the conductive members 31 are also able to reflect the light from the epitaxial structures 32 in addition to working with the electrodes 33 for supplying electricity.

In other preferred embodiments, the step 21 is conducted by forming a zinc oxide film and a silicon oxide film on the temporary substrate 41 in sequence to form the sacrificial film layer 42, followed by growing the epitaxial film layer 43. The sacrificial film portions 421 of the sacrificial film layer 42 may be configured as the substantially parallel strips or the intersecting strips. The zinc oxide film is formed into a nondense structure during the lateral growing of the epitaxial film layer 43, and thus, the removal of the sacrificial film layer 42 and the temporary substrate 41 may be conduced more easily.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating semiconductor devices, comprising:
   (a) forming over a temporary substrate a sacrificial film layer having a plurality of spaced apart sacrificial film portions, which expose partially the temporary substrate;
   (b) growing laterally and epitaxially an epitaxial film layer over the sacrificial film layer and the temporary substrate;
   (c) forming over the epitaxial film layer a patterned mask that covers partially the epitaxial film layer and that defines a plurality of through holes to expose a plurality of epitaxial surface regions, respectively;
   (d) forming a plurality of conductive members respectively in the through holes and on the epitaxial surface regions;
   (e) removing the patterned mask and removing apart of the epitaxial film layer and a part of the sacrificial film layer beneath the patterned mask until a portion of the temporary substrate therebeneath is exposed, thereby forming gaps among the conductive members and dividing the epitaxial film layer into a plurality of epitaxial structures;
   (f) removing the sacrificial film layer by wet etching; and
   (g) after the step (f), removing the temporary substrate by wet etching.

2. The method of claim 1, further comprising: (h) forming an electrode on a surface of each of the epitaxial structures opposite to a corresponding one of the conductive members after the sacrificial film layer and the temporary substrate are removed.

3. The method of claim 2, further comprising:
   attaching a removable plate to surfaces of all of the conductive members before the sacrificial film layer and the temporary substrate are removed; and
   removing the removable plate from the conductive members after the electrode is formed on each of the sacrificial structures.

4. The method of claim 1, wherein the sacrificial film portions are configured as a plurality of substantially parallel strips.

5. The method of claim 1, wherein the sacrificial film portions are configured as a plurality of intersecting strips.

6. The method of claim 1, wherein, in the step (a), the sacrificial film layer includes a zinc oxide film and a silicon oxide film.

7. The method of claim 6, wherein, in the step (c), the zinc oxide film is formed into a non-dense structure during the lateral growing of the epitaxial film layer.

8. The method of claim 1, wherein the forming of the conductive members is conducted by first forming a reflective conductive film on each of the epitaxial surface regions, followed by forming a non-reflective conductive film on the reflective conductive film that has been formed on each of the epitaxial surface regions.

9. A semiconductor device produced by the method of claim 1, comprising:
   an epitaxial structure having a first side formed with a plurality of alternating protrusions and indentations, and a rough surface on said alternating protrusions and indentations; and
   a conductive member formed on a second side of the epitaxial structure opposite to said first side.

10. The semiconductor device of claim 9, further comprising an electrode formed on said rough surface of said epitaxial structure.

11. The semiconductor device of claim 9, wherein said protrusions are configured as elongate strips.

12. The semiconductor device of claim 11, wherein said strips are substantially parallel.

13. The semiconductor device of claim 11, wherein said strips intersect each other.

* * * * *